(12) United States Patent
Graettinger et al.

(10) Patent No.: US 6,171,925 B1
(45) Date of Patent: *Jan. 9, 2001

(54) CAPACITOR, AND METHODS FOR FORMING A CAPACITOR

(75) Inventors: Thomas M. Graettinger; Paul J. Schuele, both of Boise; Brent McClure, Meridian, all of ID (US)

(73) Assignee: Micron Technology, Inc., Boise, ID (US)

( * ) Notice: Under 35 U.S.C. 154(b), the term of this patent shall be extended for 0 days.

This patent is subject to a terminal disclaimer.

(21) Appl. No.: 09/185,412

(22) Filed: Nov. 3, 1998

Related U.S. Application Data

(63) Continuation of application No. 08/670,644, filed on Jun. 26, 1996, now Pat. No. 5,843,830.

(51) Int. Cl.[7] .................................................. H01L 21/8242
(52) U.S. Cl. .............................. 438/396; 438/3; 438/240; 438/253; 257/295; 257/310; 257/306; 361/321.4
(58) Field of Search ............................... 438/3, 240, 253, 438/254, 255, 396, 397, 398; 257/295, 310, 306; 361/321.4

(56) References Cited

U.S. PATENT DOCUMENTS

| | | | |
|---|---|---|---|
| 4,464,701 | 8/1984 | Roberts et al. | 361/313 |
| 5,262,343 | 11/1993 | Rhodes et al. | 438/3 |
| 5,279,985 | 1/1994 | Kamiyama | 438/396 |
| 5,330,931 | 7/1994 | Emesh et al. | 437/60 |
| 5,335,138 | 8/1994 | Sandhu et al. | 361/303 |

(List continued on next page.)

OTHER PUBLICATIONS

Wolf, et. al., "Chemical Vapor Deposition of Amorphous and Polycrystalline Films", Silicon Processing For the VLSI Era—vol. 1, pp. 191–192, 1986.

(List continued on next page.)

*Primary Examiner*—Carl Whitehead, Jr.
*Assistant Examiner*—Toniae M. Thomas
(74) *Attorney, Agent, or Firm*—Wells, St. John, Roberts, Gregory & Matkin P.S.

(57) ABSTRACT

A method for forming a capacitor includes forming a substrate having a node location to which electrical connection to a capacitor is to be made; forming an inner capacitor plate over the node location, the inner capacitor plate having an exposed sidewall; forming an oxidation barrier layer over the exposed inner capacitor plate sidewall; forming a capacitor dielectric plate over the inner capacitor plate, the oxidation barrier layer restricting oxidation of the inner capacitor plate sidewall during formation of the capacitor dielectric plate; and forming an outer capacitor plate over the capacitor dielectric plate. A capacitor is further described which includes an inner capacitor plate having at least one sidewall; an oxidation barrier layer positioned in covering relation relative to the at least one sidewall; a capacitor dielectric plate positioned over the inner capacitor plate; and an outer capacitor plate positioned over the capacitor dielectric plate. In the preferred form of the invention, an insulating dielectric layer is positioned on the oxidation barrier layer, the insulating dielectric layer being of a different composition than the oxidation barrier layer.

1 Claim, 5 Drawing Sheets

U.S. PATENT DOCUMENTS

| | | | |
|---|---|---|---|
| 5,349,494 | 9/1994 | Ando | 361/322 |
| 5,401,680 | 3/1995 | Abt et al. | 438/3 |
| 5,438,012 | 8/1995 | Kamiyama | 438/396 |
| 5,440,157 | 8/1995 | Imai et al. | 257/310 |
| 5,442,213 | 8/1995 | Okudaira et al. | 257/310 |
| 5,444,011 | 8/1995 | Taniguchi | 438/396 |
| 5,452,178 | 9/1995 | Emesh et al. | 361/303 |
| 5,471,364 | 11/1995 | Summerfelt et al. | 361/321.4 |
| 5,486,713 | 1/1996 | Koyama | 257/310 |
| 5,489,548 | 2/1996 | Nishioka et al. | 438/396 |
| 5,492,854 | 2/1996 | Ando | 438/396 |
| 5,504,041 | 4/1996 | Summerfelt | 438/396 |
| 5,548,157 * | 8/1996 | Sakao et al. | 257/532 |
| 5,567,636 | 10/1996 | Jones, Jr. | 437/43 |
| 5,621,606 | 4/1997 | Hwang | 361/321.4 |
| 5,637,527 | 6/1997 | Baek | 438/396 |
| 5,641,702 | 6/1997 | Imai et al. | 438/396 |
| 5,654,222 | 8/1997 | Sandhu et al. | 438/3 |
| 5,663,088 | 9/1997 | Sandhu et al. | 438/396 |
| 5,717,236 | 2/1998 | Shinkwata | 257/306 |
| 5,786,248 | 7/1998 | Schuegraf | 438/240 |

OTHER PUBLICATIONS

Kamiyama, S., et. al., "Highly Reliable 2.5nm $Ta_2O_5$ Capacitor Process Technology for 256Mbit DRAMs", 1991 IEEE, pp. 827–830.

Kamiyama, S., et. al., "Ultrathin Tantalum Oxide Capacitor Dielectric Layers Fabricated Using Rapid Thermal Nitridation prior to Low Pressure Chemical Vapor Deposition", J. Electrochem. Soc., vol. 140, No. 6, Jun. 1993, pp. 1617–1625.

Eimori, T., et. al., "A Newly Designed Planar Stacked Capacitor Cell with High dielectric Constant Film for 256Mbit DRAM", 1993 IEEE, pp. 631–634.

U.S. application No. 08/994,054, Parekh et al., Filed Dec. 19, 1997.

U.S. application No. 08/916,771, DeBoer et al., Filed Aug. 20, 1997.

Fazan, P.C., et. al., "A High–C Capacitor (20.4fF/$\mu m^2$) with Ultrathin CVD–$Ta_2O_5$ Films Deposited on Rugged Poly–Si for High Density DRAMs", 1992 IEEE, pp. 263–266.

Lesaicherre, P–Y, et. al., "A Gbit–Scale DRAM Stacked Capacitor Technology with ECR MOCVD $SrTiO_3$ and RIE Patterned $RuO_2$/TiN Storage Nodes", 1994 IEEE, pp. 831–834.

Yamaguchi, H., et. al., "Structural and Electrical Characterization of $SrTiO_3$ Thin Films Prepared by Metal Organic Chemical Vapor Deposition", Jpn. J. Appl. Phys. vol. 32 (1993), Pt. 1, No. 9B, pp. 4069–4073.

* cited by examiner

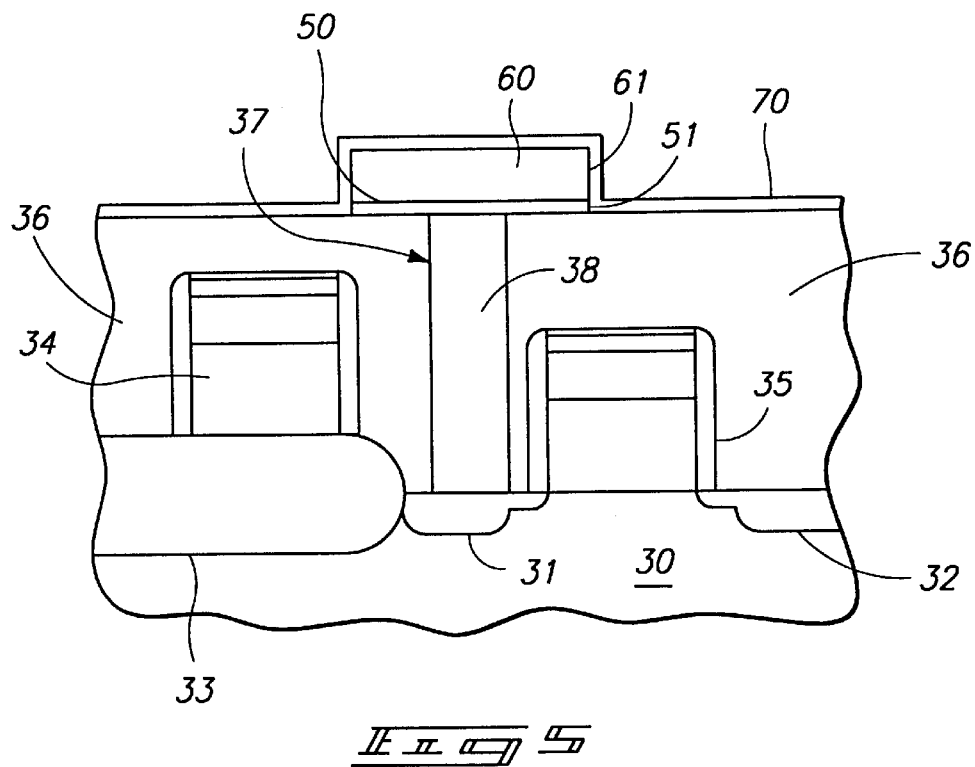
_Fig 5_
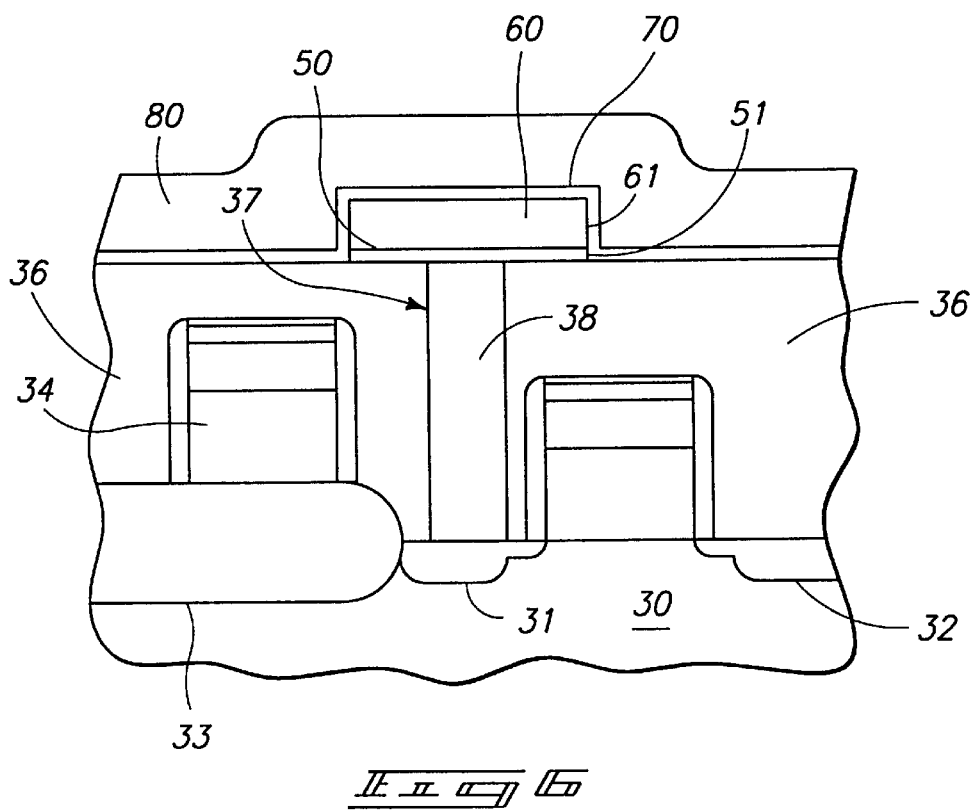
_Fig 6_

US 6,171,925 B1

CAPACITOR, AND METHODS FOR FORMING A CAPACITOR

RELATED PATENT DATA

This application is a continuation application of Ser. No. 08/670,644, which was filed on Jun. 26, 1996, now U.S. Pat. No. 5,843,830.

This invention was made with Government support under Contract Nos. MDA972-93-C-0033 and MDA-972-94-C-0006 awarded by Advanced Research Projects Agency (ARPA). The Government has certain rights in this invention.

TECHNICAL FIELD

This invention relates to a capacitor, and methods for forming a capacitor.

BACKGROUND OF THE INVENTION

In the processing of integrated circuits electrical contact must be made to active device regions formed within the wafer substrate typically comprising nocrystalline silicon. The active device regions are connected by highly conductive paths or lines which are fabricated above an insulator material, and which covers the substrate surface. To provide electrical connection between the conductive path and active device regions, an opening or contact is provided. Ultimately, an electrically conductive contact filling material is provided in the contact opening to make electrical contact to the underlying active device region.

It is desirable during the processing of integrated circuits to provide an intervening layer to prevent the intermixing of the contact filling materials with silicide and the underlying silicon. Accordingly, this intervening layer is typically provided to prevent the diffusion of the silicon and silicide with an associated plug filling material and to effectively adhere the plug filling material to the underlying substrate. Such material is accordingly also electrically conductive and commonly referred to as a "barrier layer" due to the anti-diffusion properties of same.

In the formation of a stacked capacitor structure which is employed in a DRAM, a lower electrode is typically electrically connected to another substrate device by means of a polysilicon plug. Normally, the barrier layer separates the polysilicon plug from the lower electrode of the capacitor to prevent both silicon diffusion into the electrode and oxidation of the plug which may be occasioned by the continued processing of the integrated circuit. A DRAM storage node capacitor is formed when a dielectric layer is interposed between a lower electrode and an upper electrode. The capacitor is typically covered and protected by a planarized layer of silicon dioxide. The capacitor is accessed by a bit line contact through a field effect transistor gated by a word line.

The above design is not without drawbacks. For example, to obtain useful electrical performance, the dielectric layer is typically deposited or otherwise annealed at a very high temperature and in an oxygen ambient. Under these processing conditions, oxidation of the underlying barrier layer, polysilicon plug or active area may undesirably occur. If oxide forms, a parasitic capacitor will be created. This parasitic capacitor would be disposed in series with the storage node capacitor. The resulting parasitic capacitor will prevent the full application of voltage to the storage node. This, in turn, will result in a decrease in the amount of charge which can be stored by the capacitor.

In addition to the problems outlined above, designers of integrated circuits are often faced with difficulties in providing adequate coverage of high dielectric constant materials over typical capacitor geometries utilized in high density DRAMS and other memory circuitry.

It would be desirable, therefore, to improve upon the design of a capacitor and methods for forming a capacitor which achieves the benefits to be derived from prior fabrication techniques, but avoids the above and other detriments individually associated therewith.

BRIEF DESCRIPTION OF THE DRAWINGS

Preferred embodiments of the invention are described below with reference to the following accompanying drawings.

FIG. 5 is a view of the FIG. 2 wafer at a processing step subsequent to that shown by FIG. 4.

FIG. 6 is a view of the FIG. 2 wafer at a processing step subsequent to that shown in FIG. 5.

DETAILED DESCRIPTION OF THE PREFERRED EMBODIMENTS

Figure 1:
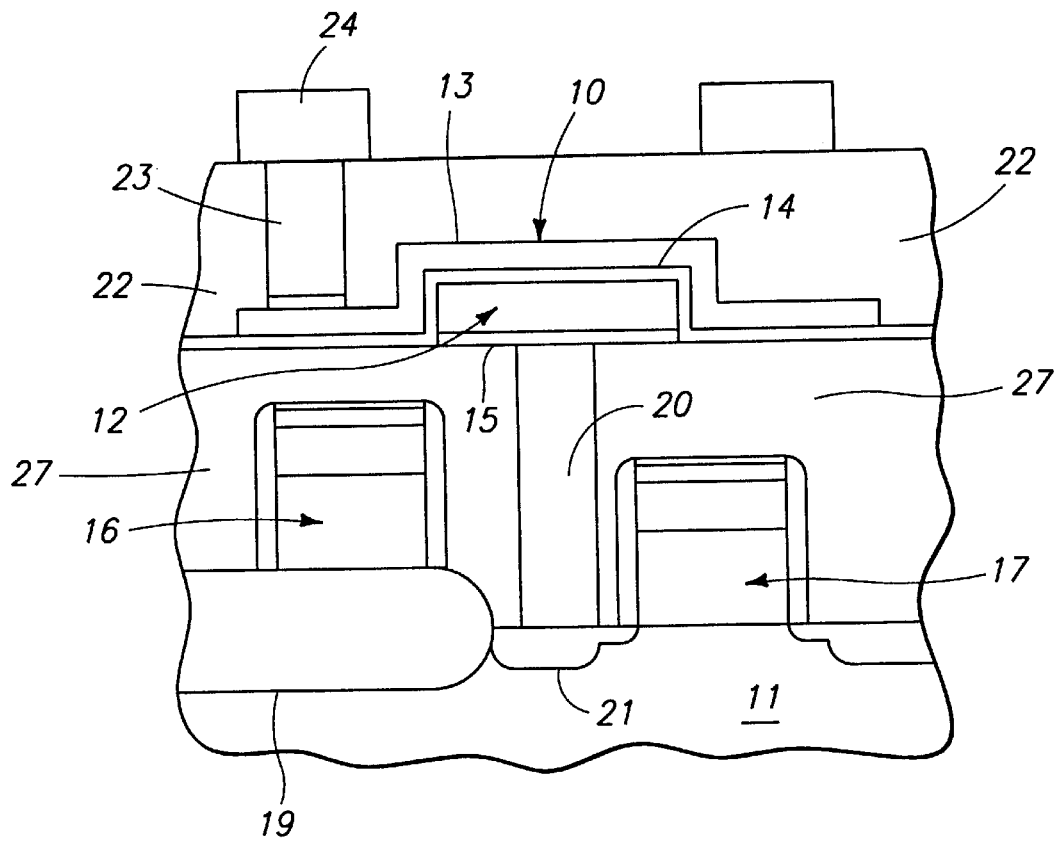
FIG. 1 is a diagrammatic, sectional view of a prior art semiconductor wafer.

This disclosure of the invention is submitted in furtherance of the constitutional purposes of the U.S. Patent Laws "to promote the progress of science and useful arts" (Article 1, Section 8).

One aspect of the present invention relates to a method for forming a capacitor which includes:

providing a substrate having a node location to which electrical connection to a capacitor is to be made;

forming an inner capacitor plate over the node location, the inner capacitor plate having an exposed sidewall;

forming an oxidation barrier layer over the exposed inner capacitor plate sidewall;

forming a capacitor dielectric plate over the inner capacitor plate, the oxidation barrier layer restricting oxidation of the inner capacitor plate sidewall during provision of the capacitor dielectric plate; and forming an outer capacitor plate over the capacitor dielectric plate.

Another aspect of the present invention relates to a method for forming a capacitor which includes:

providing a substrate having a node location to which electrical connection to a capacitor is to be made;

forming a diffusion barrier layer over the node location;

forming an inner capacitor plate over the diffusion barrier layer, the inner capacitor plate and diffusion barrier layer being patterned to respectively have an exposed sidewall;

forming an oxidation barrier layer over the inner capacitor plate sidewall and diffusion barrier layer sidewall;

forming a capacitor dielectric plate over the inner capacitor plate, the oxidation barrier layer restricting oxidation of at least the inner capacitor plate sidewall during provision of the capacitor dielectric plate; and forming an outer capacitor plate over the capacitor dielectric plate.

Still, a further aspect of the present invention relates to a capacitor which comprises:

an inner capacitor plate having at least one sidewall;

an oxidation barrier layer positioned in covering relation relative to at least one sidewall;

a capacitor dielectric plate positioned over the inner capacitor plate; and an outer capacitor plate positioned over the capacitor dielectric plate.

To best understand the present invention a prior art capacitor 10 is described with reference to FIG. 1. The capacitor 10 is formed relative to a silicon substrate 11 in association with DRAM integrated circuitry. A field oxide region 19 and a pair of word lines 16 and 17, are formed relative to the substrate 11. The capacitor 10 has a lower electrode 12; an upper electrode 13, which is spaced therefrom; and a dielectric layer 14 which is positioned intermediate the upper and lower electrodes 12 and 13, respectively. A diffusion barrier layer 15 is positioned between the lower electrode 12, and a planarized silicon dioxide layer 27. The planarized silicon dioxide layer 27 is formed outwardly of the substrate 11, and the word lines 16 and 17. A polysilicon plug 20 is ohmically electrically connected to the diffusion barrier layer 15. The diffusion barrier layer 15 is formed to prevent the diffusion of silicon from the conductive plug 20 into the capacitor 10. One material of choice for use as a diffusion barrier layer 15 is titanium nitride. Titanium nitride is an attractive material as a contact diffusion barrier in integrated circuits because it behaves as a substantially impermeable barrier to the diffusion of silicon, and because the activation energy for the diffusion of other impurities is very high. Titanium nitride is also chemically and thermodynamically very stable and exhibits low electrical resistivity typical of the transition metal carbides, borides and nitrides.

Titanium nitride can be provided or formed in one of the following manners:

a) by evaporating titanium in a nitrogen ambient;

b) reactively sputtering titanium in an argon and nitrogen mixture;

c) sputtering from a titanium nitride target in an inert argon ambient;

d) sputter depositing titanium in an argon ambient and converting it to titanium nitride in a separate plasma nitridation step; or e) by low pressure chemical vapor deposition.

As seen in FIG. 1, the polysilicon plug 20 is electrically connected with an underlying diffusion region 21 formed in the silicon substrate 11 and which is associated with the word line 17. A planarized silicon dioxide layer 22 over lies outer capacitor electrode 13. An electrically conductive contact plug 23 is formed through silicon dioxide layer 22, and is in ohmic electrical contact with the outer capacitor cell plate 13. An interconnect line 24 is formed outwardly of the silicon dioxide layer 22, with the conductive plug 23 electrically connecting the interconnect line 24, with the upper cell plate 13.

Preferred methods for fabricating the capacitor 10 include the deposit of a high dielectric constant material plate layer 14 at a high temperature and in an oxygen ambient. Under these processing conditions, if oxidation of the diffusion barrier layer 15, polysilicon plug 20, or underlying diffusion region 21 occurs, a parasitic capacitor will be formed in series with the capacitor 10. Further, the illustrated sidewalls of lower electrode 12 will oxidize, further adding to the undesired parasitic capacitor effects. For this and other reasons, the present method for forming a capacitor comprises the following steps:

forming an inner capacitor plate layer, the inner capacitor plate layer having a sidewall; and forming a capacitor dielectric plate over the inner capacitor plate under conditions which would effectively oxidize the inner capacitor plate sidewall, the method comprising shielding the inner capacitor plate sidewall from substantial oxidation during the provision of the capacitor dielectric plate under said conditions. Preferred features of this method are discussed in detail in the paragraphs which follow.

Figure 2:
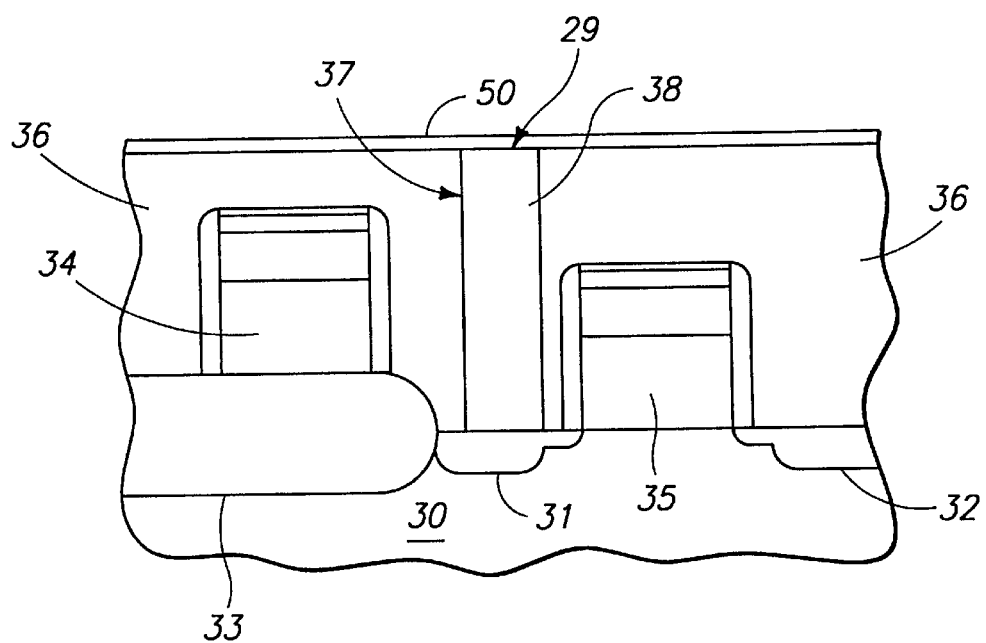
FIG. 2 is a diagrammatic, sectional view of a semiconductor wafer at one processing step in accordance with the present invention.

The current invention is shown in FIGS. 2 through 10. As illustrated in FIG. 2, a silicon substrate 30 is provided, and has diffusion regions 31 and 32 formed therein. A field oxide region 33, and a pair of word lines 34 and 35 are also formed outwardly relative to the substrate 30. A layer of silicon dioxide 36 is provided outwardly of the silicon substrate 30 and is disposed in covering relation relative to the word lines 34 and 35. Electrical connection to the underlying region 31 is formed by opening a contact 37 to the underlying region 31. Thereafter, a conductive plug 38, which is preferably polysilicon, is provided in the contact opening. For purposes of this continuing discussion, the outermost portion of plug 38 constitutes a node location 29 to which electrical connection to a capacitor 10 is to be made. Following the provision of the conductive plug 38, a diffusion barrier layer 50, for example titanium nitride or another transition metal nitride is formed to a thickness of about 500 Angstroms atop the silicon dioxide layer 36 and node location 29.

Figure 3:
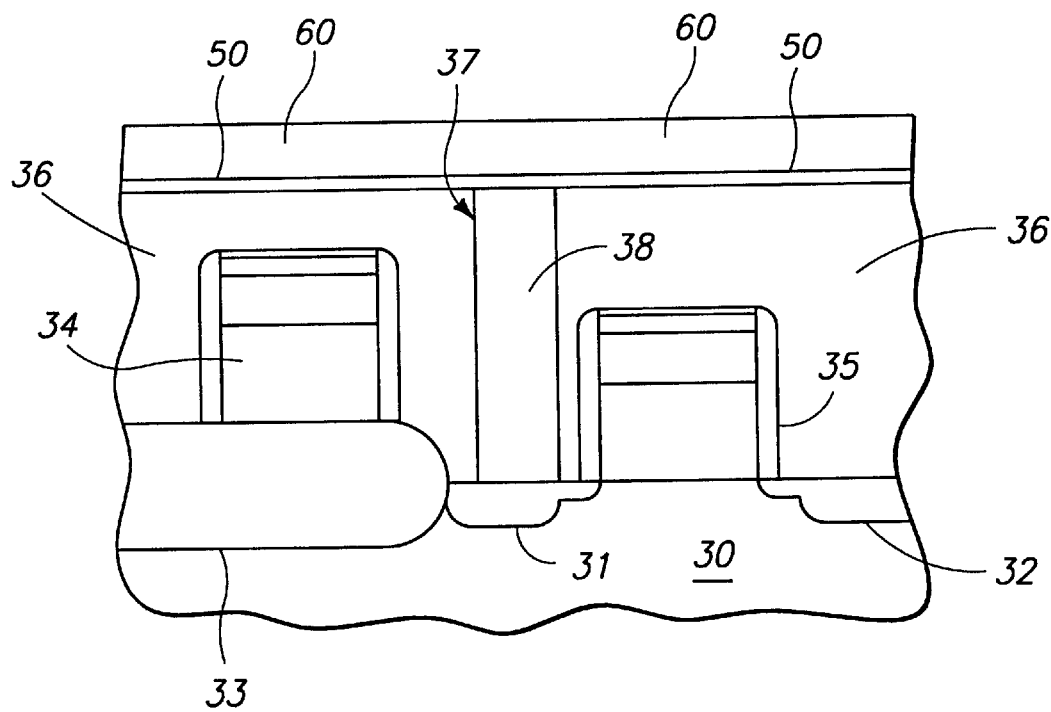
FIG. 3 is a view of the FIG. 2 wafer at a processing step subsequent to that shown by FIG. 2.
Figure 4:
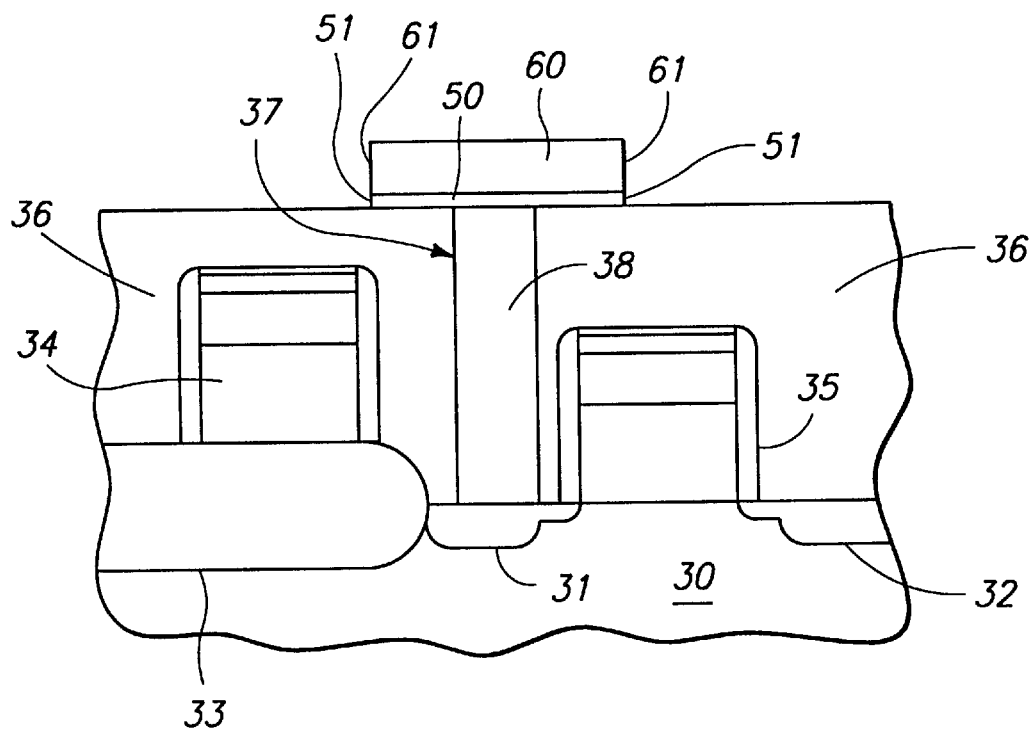
FIG. 4 is a view of the FIG. 2 wafer at a processing step subsequent to that shown in FIG. 3.

Referring now to FIG. 3, an inner capacitor plate layer 60 is formed over the barrier layer 50 and accordingly the node location 29. Most preferably, the inner capacitor plate layer comprises platinum which is formed to a thickness of approximately 500 to about 3,000 Angstroms. Referring now to FIG. 4, conditions are provided which are effective to pattern and remove a portion of the diffusion barrier layer 50, and the inner capacitor plate layer 60 into a desired shape by means of a dry etching process. An example dry etching chemistry includes $Cl_2$. The patterning and etching step above, results in the diffusion barrier layer 50 and plate layer 60 having exposed sidewalls 51 and 61, respectively.

Referring now to FIG. 5, after forming the inner capacitor plate 60, the method further comprises forming an oxidation barrier layer 70, which is preferably a dielectric material, over the exposed inner capacitor plate sidewalls 61 and the diffusion barrier sidewalls 51. The preferred oxidation barrier layer 70 is silicon nitride which is formed to a thickness of about 500 Angstroms. Most preferably, the oxidation barrier layer 70 has a thickness which is less than the thickness dimension of the inner capacitor plate layer 60.

Referring now to FIG. 6, and after forming the oxidation barrier layer 70, an oxide layer 80, preferably comprising silicon dioxide, is formed atop the oxidation barrier layer 70. This silicon dioxide layer 80 is preferably formed to a thickness of greater than about 5,000 Angstroms.

Figure 7:
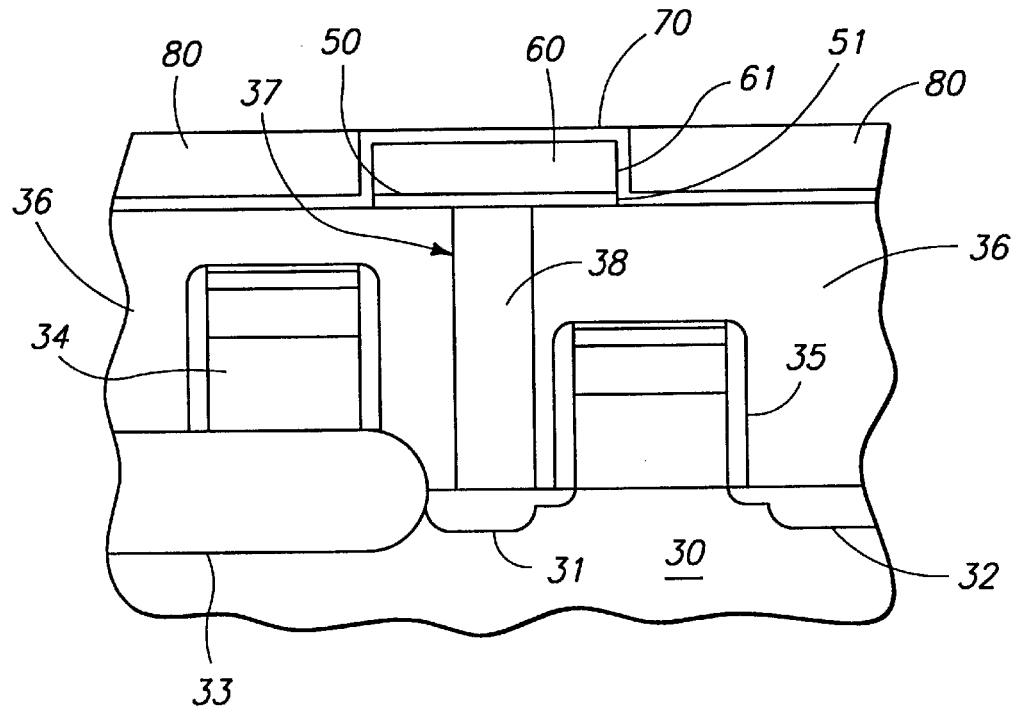
FIG. 7 is a view of the FIG. 2 wafer at a processing step subsequent to that shown in FIG. 6.

Referring now to FIG. 7, conditions are provided which are effective to planarize, preferably by means of chemical mechanical polishing (CMP) or resist etch-back, the silicon dioxide layer 80 relative to the oxidation barrier layer 70. The selected technique preferably has high selectivity for stopping on silicon nitride 70, as shown. A preferred CMP technique employs a slurry containing abrasive particles which selectively remove $SiO_2$ when used in conjunction with a perforated pad rotating at low polishing speeds.

Figure 8:
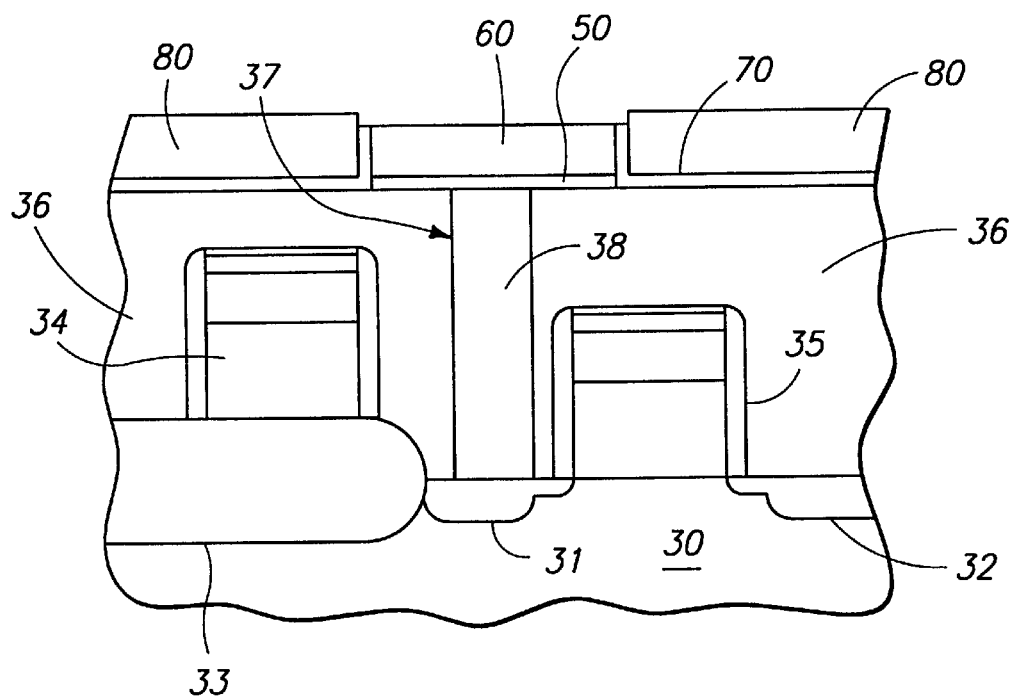
FIG. 8 is a view of the FIG. 2 wafer at a processing step subsequent to that shown in FIG. 7.

Referring now to FIG. 8, after the planarization step, and before forming the capacitor dielectric plate 90, the method further comprises removing the oxidation barrier layer 70 from atop the inner capacitor plate 60. This removal is preferably achieved by a dry etching chemistry having a high selectivity for etching silicon nitride relative to silicon dioxide. An example chemistry includes $CF_4$ or $CF_4$ in the presence of $O_2$.

Figure 9:
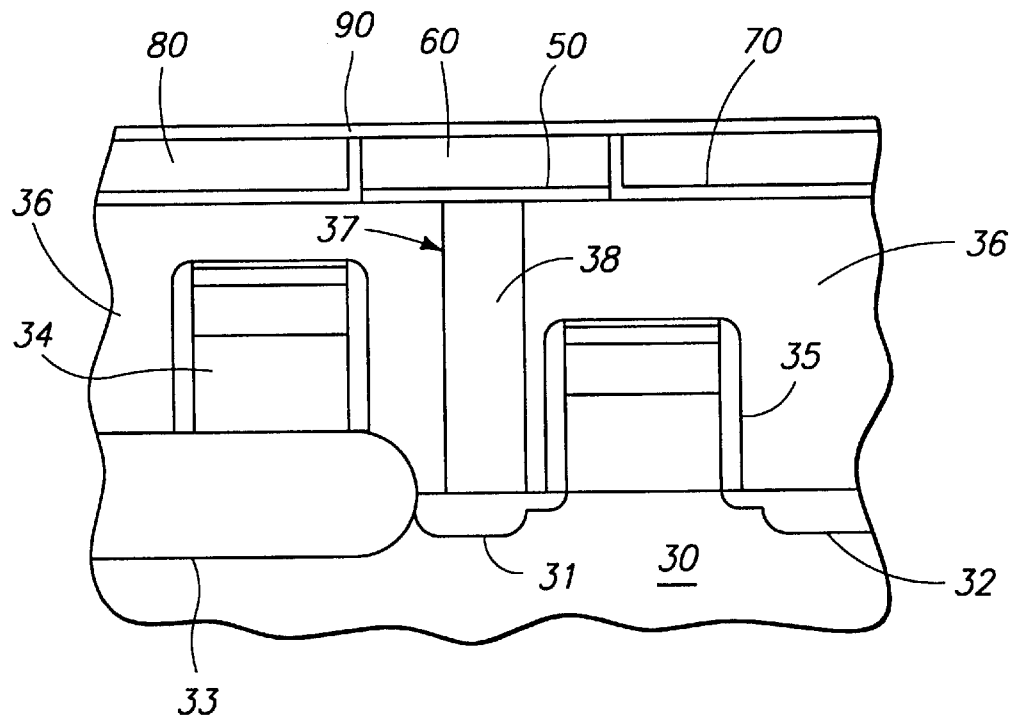
FIG. 9 is a view of the FIG. 2 wafer at a processing step subsequent to that shown in FIG. 8.

Referring now to FIG. 9, following the step of removing the oxidation barrier layer 70 from atop the inner capacitor plate 60 to expose the inner capacitor plate 60, the method further comprises forming a capacitor dielectric plate 90 atop the lower capacitor plate 60. The capacitor dielectric plate 90 comprises preferably a high dielectric constant material or a ferroelectric material. In the context of this document, "high dielectric constant" means greater than about 20. Specific example materials include $Ba_x Sr_{1-x} TiO_3$; $PbZr_x Ti_{1-x} O_3$ and $SrBi_2 Ta_2 O_9$.

Figure 10:
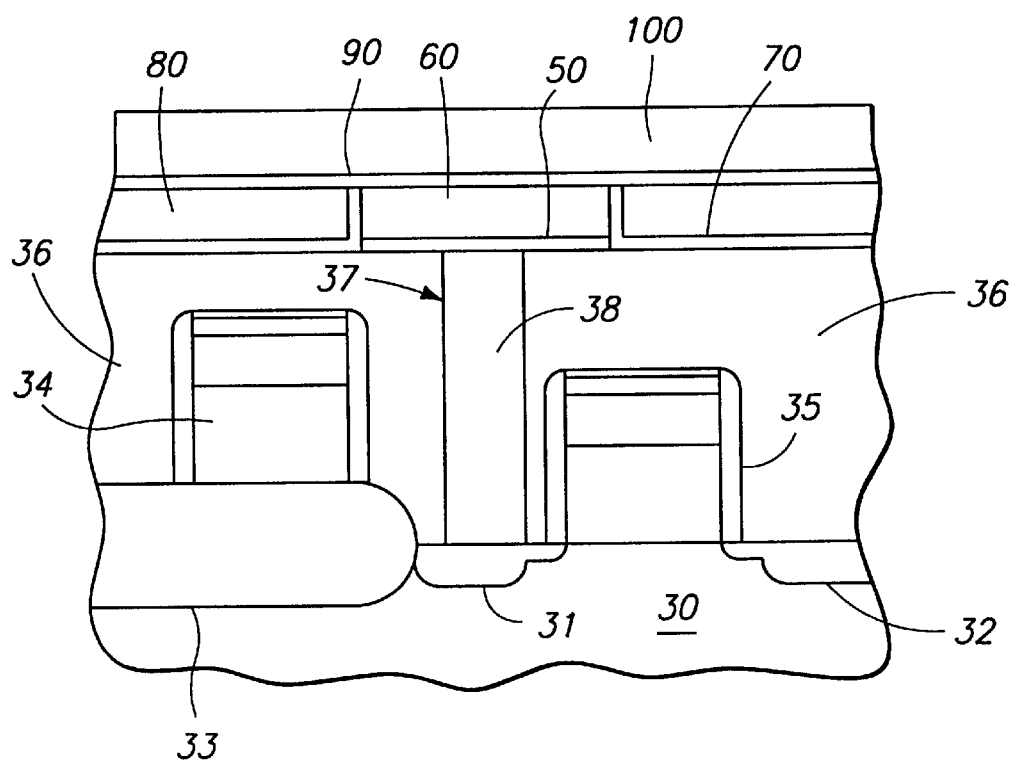
FIG. 10 is a view of the FIG. 9 wafer at a processing step subsequent to that shown in FIG. 9.

As seen in FIG. 10, an outer capacitor plate 100, which is preferably platinum, is thereafter formed. As will be recognized, the method of the present invention provides a means for forming a capacitor wherein the inner capacitor plate sidewall 61 is shielded from substantial oxidation during the provision of the capacitor dielectric plate 90 under normal processing conditions. Thus, parasitic capacitor formation is reduced or substantially eliminated.

In compliance with the statute, the invention has been described in language more or less specific as to structural and methodical features; it is to be understood, however, that the invention is not limited to specific features described, since the means disclosed herein comprise preferred forms of putting the invention into effect. The invention is, therefore, claimed in any of its forms or modifications within the proper scope of the appended claims appropriately interpreted with the Doctrine of Equivalents.

What is claimed is:

1. A method for forming an electrical component, comprising:

providing a substrate having a first electrical component which has a top surface, and a sidewall, and wherein a diffusion barrier layer is disposed intermediate the first electrical component and the substrate, and wherein the first electrical component makes electrical connection with the underlying substrate;

forming an oxidation barrier layer over the top surface and the sidewall of the first electrical component, and wherein the oxidation barrier layer comprises silicon nitride which is formed to a thickness of about 500 Angstroms;

then after forming the oxidation barrier layer, forming an oxide layer over the oxidation barrier layer;

after forming the oxide layer, selectively planarizing the oxide layer relative to the oxidation barrier layer overlying the top surface of the first electrical component;

after planarizing the oxide layer, removing the oxidation barrier layer from atop the first electrical component;

forming a planar dielectric plate over the top surface of the first electrical component, and wherein the oxidation barrier layer remaining in covering relation over the sidewall of the first electrical component inhibits oxidation of the sidewall during the provision of the planar dielectric layer; and forming a second electrical component over the planar dielectric layer and which is electrically coupled with the first electrical component.

* * * * *

UNITED STATES PATENT AND TRADEMARK OFFICE
CERTIFICATE OF CORRECTION

PATENT NO : 6,171,925
DATED : January 9, 2001
INVENTOR(S) : Thomas M. Graettinger et al.

It is certified that error appears in the above-identified patent and that said Letters Patent are hereby corrected as shown below:

Col. 1, line 23
 replace "nocrystalline"
 with --monocrystalline--.

Signed and Sealed this

Eighth Day of May, 2001

Attest:

NICHOLAS P. GODICI

*Attesting Officer*  Acting Director of the United States Patent and Trademark Office